United States Patent
Cho et al.

(10) Patent No.: US 7,153,745 B2
(45) Date of Patent: Dec. 26, 2006

(54) RECESSED GATE TRANSISTOR STRUCTURE AND METHOD OF FORMING THE SAME

(75) Inventors: Min-Hee Cho, Gyeonggi-do (KR); Ji-Young Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/963,928

(22) Filed: Oct. 12, 2004

(65) Prior Publication Data

US 2005/0079661 A1    Apr. 14, 2005

(30) Foreign Application Priority Data

Oct. 13, 2003    (KR) .................. 10-2003-0070924

(51) Int. Cl.
*H01L 21/336* (2006.01)
(52) U.S. Cl. .............. 438/270; 438/271; 438/272; 257/E21.419
(58) Field of Classification Search .......... 438/271, 438/272
See application file for complete search history.

(56) References Cited

U.S. PATENT DOCUMENTS

| | | | |
|---|---|---|---|
| 6,153,475 A | 11/2000 | Hofmann et al. | |
| 6,214,670 B1 * | 4/2001 | Shih et al. | ................... 438/259 |
| 6,498,062 B1 * | 12/2002 | Durcan et al. | ............... 438/246 |

* cited by examiner

*Primary Examiner*—Michael Lebentritt
*Assistant Examiner*—Cheung Lee
(74) *Attorney, Agent, or Firm*—Marger Johnson & McCollom, P.C.

(57) ABSTRACT

Recessed gate transistor structures and methods for making the same prevent a short between a gate conductive layer formed on a non-active region and an active region by forming an insulation layer therebetween, even though a misalignment is generated in forming a gate. The method and structure reduce the capacitance between gates. The method includes forming a device isolation film for defining an active region and a non-active region, on a predetermined region of a semiconductor substrate. First and second insulation layers are formed on an entire face of the substrate. A recess is formed in a portion of the active region. A gate insulation layer is formed within the recess, and then a first gate conductive layer is formed within the recess. A second gate conductive layer is formed on the second insulation layer and the first gate conductive layer. Subsequently, source/drain regions are formed.

17 Claims, 7 Drawing Sheets

RECESSED GATE TRANSISTOR STRUCTURE AND METHOD OF FORMING THE SAME

CROSS REFERENCE TO RELATED APPLICATIONS

This application claims priority from Korean Patent Application No. 2003-70924, filed on Oct. 13, 2003, the contents of which are hereby incorporated by reference for all purposes.

BACKGROUND OF THE INVENTION

1. Field of the Invention

This disclosure relates to a MOS transistor, and more particularly, to a recessed gate transistor structure having a recess type gate, and a method of forming the same.

2. Description of the Related Art

Techniques of manufacturing semiconductor devices are being developed worldwide in response to the requirements of semiconductor users, and through the endeavors of semiconductor manufacturers. In addition, semiconductor manufacturers are developing enhanced high-speed, miniaturized, highly-integrated, and large-capacity semiconductor devices through more stabilized and smooth operations. Design rules for semiconductor devices are reduced in order to integrate more semiconductor devices in a semiconductor chip of limited size. These efforts reduce intervals between gates, potentially causing among other problems, a short or leakage current.

In order to solve the shortcomings it is well known in the art that a recessed gate type transistor with a gate insulation layer is formed in both the side wall and bottom face of a recess formed in a substrate. Then a conductive layer, such as polysilicon, is filled within the recess. This is in contrast to a planar gate type transistor having a gate electrode formed on a planar substrate.

A conventional recessed gate forming method is described as follows, referring to FIGS. 1 to 6.

Figure 1:
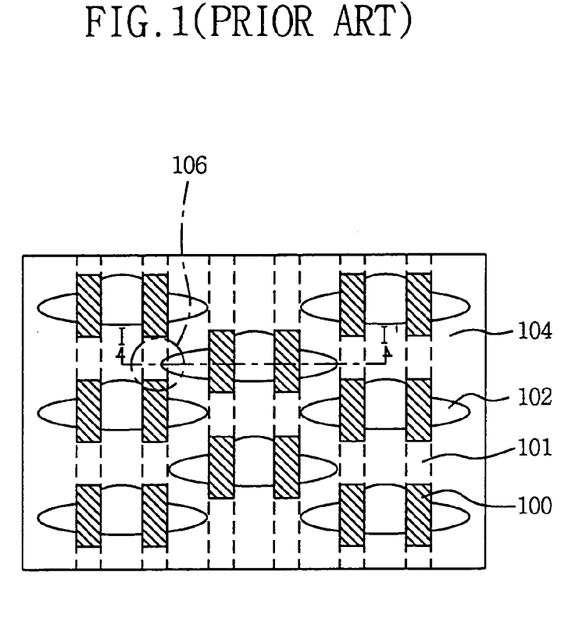
FIG. 1 is a layout of a conventional recessed gate transistor.

FIG. 1 is a layout of a conventional recessed gate transistor. FIGS. 2 to 5 are cross-sectional views illustrating a method of forming a conventional recessed gate transistor. FIG. 6 is a cross-sectional view illustrating a misalignment generated while forming the conventional recessed gate transistor. FIGS. 2 to 6 illustrate a cross-sectional face along the line I–I' in FIG. 1.

With reference to FIGS. 1 through 6, the layout of the conventional recessed gate transistor and the conventional method of forming recessed gate transistors will be described.

Referring first to FIG. 1, two substantially parallel patterned first-gate electrodes 101 are disposed perpendicular to a length direction of each active region 102. Each active region 102 is surrounded by a non-active region 104. Thus, several transistors are manufactured simultaneously. Second gate electrodes 100, formed in a recess only on the active regions 102, are disposed under the first gate electrodes 101. The first gate electrodes 101 are distanced substantially uniformly from each other and are disposed substantially parallel. However, if a misalignment is generated while forming the first gate electrode 101, the first gate electrode 101 disposed on the non-active region 104 contacts (106) a portion of an adjacent active region, causing a short, as shown in FIG. 1.

Figure 2:
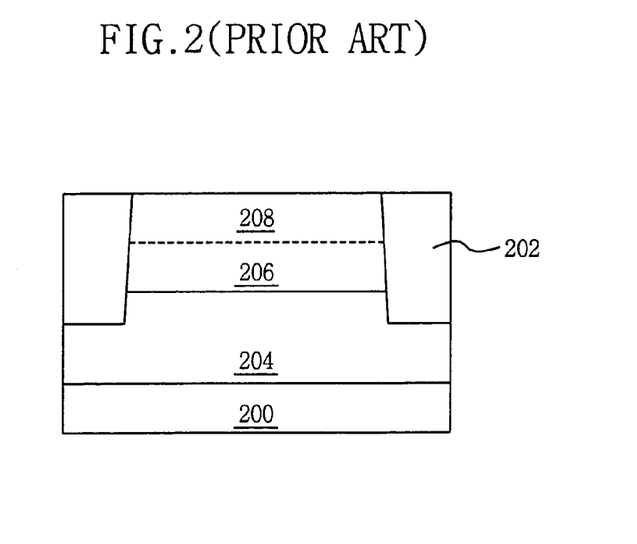
FIGS. 2 to 5 are cross-sectional views of line I–I' shown in FIG. 1 for a process for forming a conventional recessed gate transistor.

Referring to FIG. 2, a device isolation film 202 for defining the active region and the non-active region is formed in a determined region of a p- type semiconductor substrate 200, and a well region 204 is formed by ion implanting p- type impurities into the semiconductor substrate. Subsequently, a threshold voltage control region 206 is formed by ion implanting the p- type impurities into the active region defined by the device isolation film 202, then an impurity induction layer 208 is formed by ion implanting n- type impurity into the active region.

Figure 3:
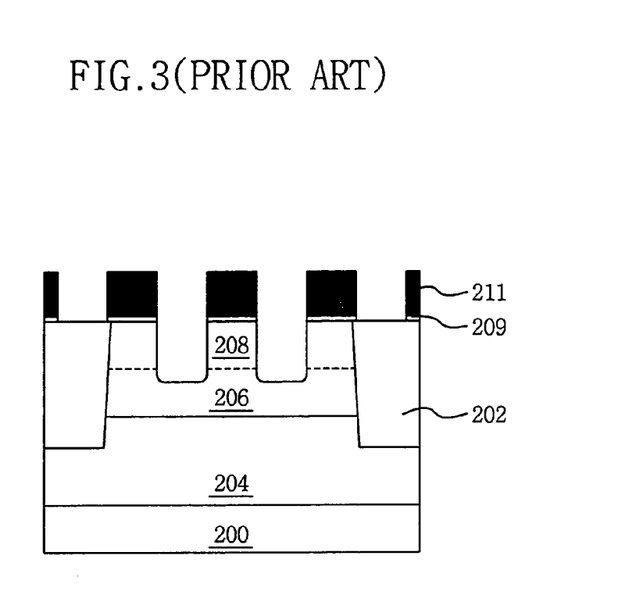

With reference to FIG. 3, a silicon nitride layer 209 and an oxide layer 211 are formed thereon, next a recess is formed at a portion of the active region through a photolithography process.

Figure 4:
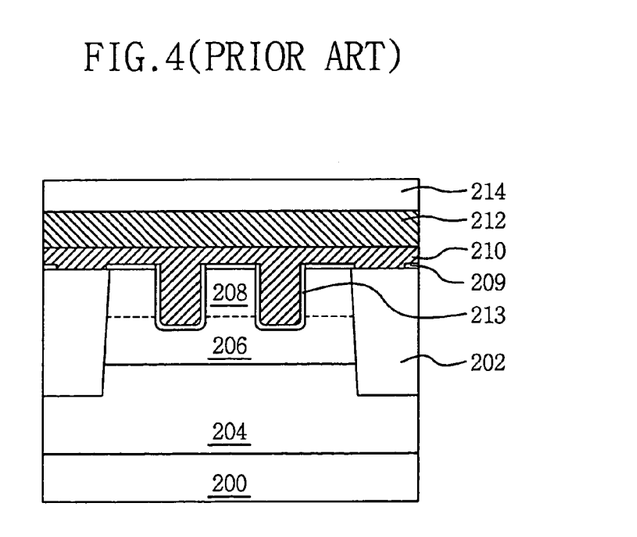

Referring to FIG. 4, a gate oxide layer 213 is formed within the recess, and then a polysilicon layer 210 is formed to fully fill into the recess with the gate oxide layer. Subsequently, a conductive layer 212 and a capping layer 214 are sequentially formed on the polysilicon layer 210.

Figure 5:
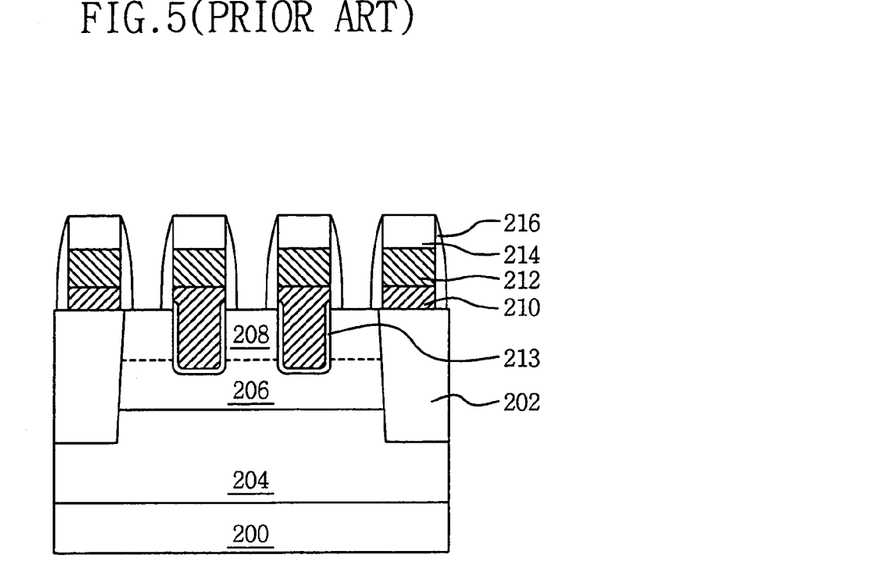
Figure 6:
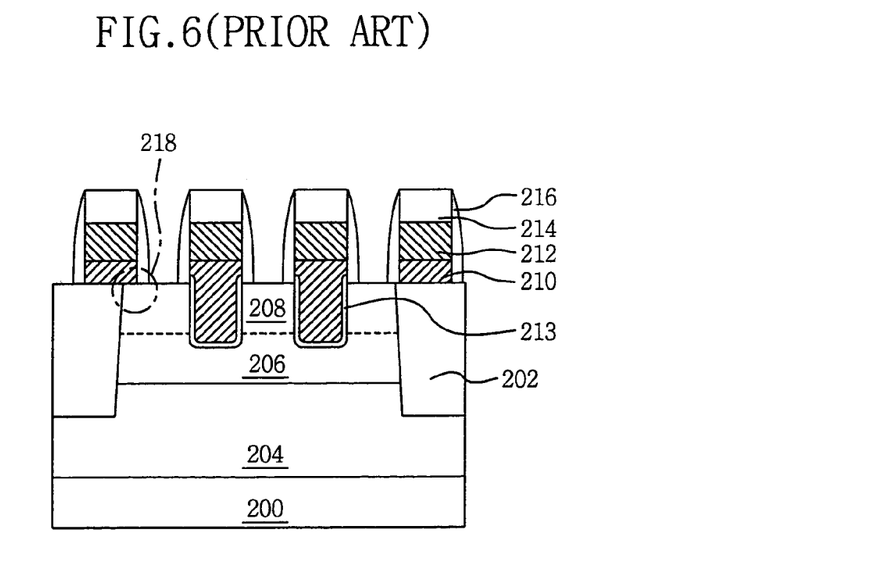
FIG. 6 is a cross-sectional view illustrating a misalignment generated while forming a conventional recessed gate transistor.

With reference to FIG. 5, a gate stack is formed through a photolithography process. Then relatively low energy n-type impurity ions are implanted into the impurity induction layer 208 using the gate stack as an ion implantation mask, forming a low density n– type source/drain region. Next, a gate spacer 216 is formed in a sidewall of the gate stack, then relatively high energy impurity ions are implanted into the n– type source/drain region using the gate spacer as an ion implantation mask. Thus, a high density n+ type source/drain region is formed on a portion of the low density n–type source/drain region. Thereby, the conventional recessed gate transistor is obtained.

Referring to FIG. 6, the gate to be formed on an upper part of the non-active region actually contacts (218) with an upper part of the active region because of a misalignment, causing a short.

The conventional gates are formed on all the active and non-active regions. This may bring about a short effect between the gate conductive layer formed on the non-active region and the active region if there are misalignments while forming the gate. Also, in a subsequent process a short is generated between a self aligned contact (SAC) and the active region. The short is caused by the misalignment because an alignment margin can't be sufficiently ensured as design rules for semiconductor devices are gradually reduced.

Embodiments of the invention address these problems.

SUMMARY OF THE INVENTION

Embodiments of the invention provide a recessed gate transistor structure and a method for making the same, capable of preventing a short between a gate conductive layer formed on a non-active region and an active region by forming an insulation layer therebetween, even though misalignments may occur while forming a gate. Also the structure reduces the height of the gate conductive layer formed on the non-active region and substantially reduces the capacitance between gates by forming an insulation layer under the gate conductive layer.

BRIEF DESCRIPTION OF THE DRAWINGS

The above and other features of embodiments of the invention will become readily apparent from the description that follows, with reference to the attached drawings in which.

DETAILED DESCRIPTION OF THE PREFERRED EMBODIMENTS

Preferred embodiments of the invention are described below in detail with reference to FIGS. 7 to 13. The invention may be embodied in many different forms and should not be construed as being limited to the embodiments set forth herein. Rather, these embodiments are provided so that this disclosure is thorough and complete, and to convey the concept of the invention to those skilled in the art.

Figure 7:
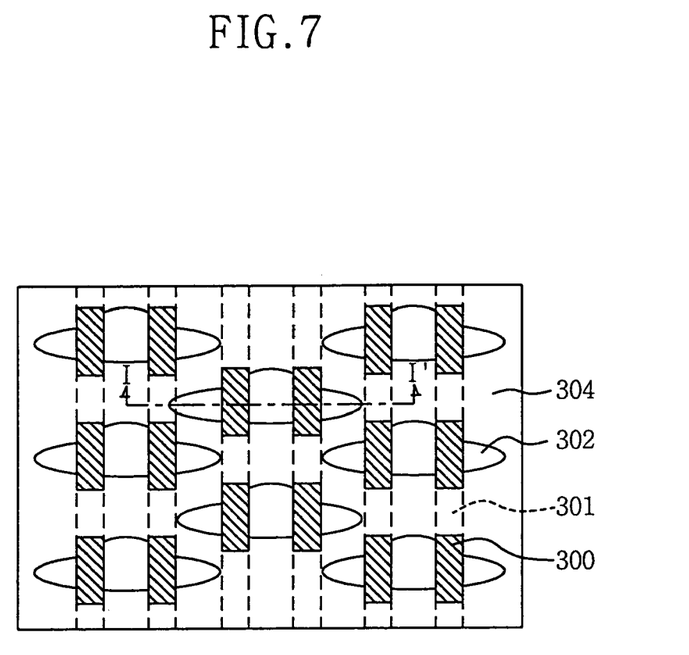
FIG. 7 is a layout of a recessed gate transistor according to an embodiment of the invention.

FIG. 7 is a layout of a recessed gate transistor according to an embodiment of the invention. FIGS. 8 to 13 are cross-sectional views illustrating processes of forming a recessed gate transistor according to an embodiment of the invention.

Referring first to FIG. 7, in order to fabricate several transistors simultaneously, two first-gate electrodes 301 patterned substantially parallel with each other are disposed substantially perpendicular to a length direction of each active region 302.

The adjacent active regions 302 are periodically arrayed in a staggered alignment. The active region 302 may be formed in T or I shape. In the T shape, a projected portion for a formation of a bit line extends in one direction from a center portion. The I shape, without a projected portion, or the T shape is formed to be surrounded by the non-active region 304. Each active region 302 is distanced equally between adjacent active regions 302. The first gate electrode 301 is substantially perpendicular to the length direction of the active region 302. Two first-gate electrodes 301 are disposed substantially parallel in every active region. A second gate electrode 300 is formed in a recess under the first gate electrode 301 and is disposed only on a portion of the active region 302.

Referring to FIGS. 8 to 13 illustrating cross-sectional views of line I–I' shown in a layout of FIG. 7, a process of forming a recessed gate transistor will be described in detail.

Figure 8:
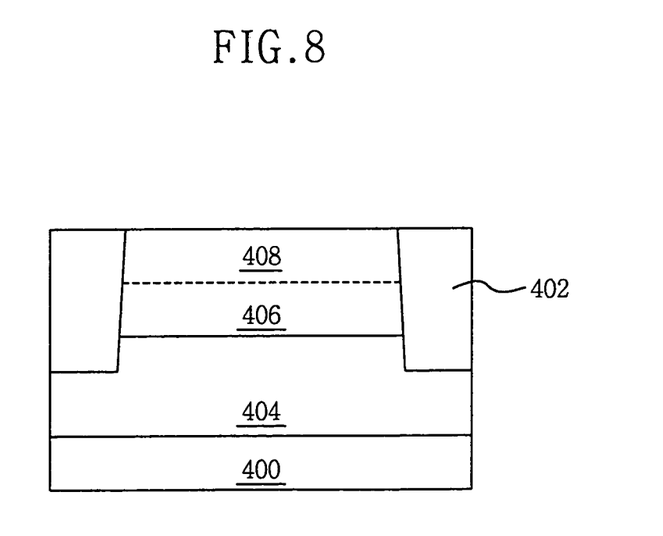
FIGS. 8 to 13 are cross-sectional views of line I–I' shown in FIG. 7 for a process for forming a recessed gate transistor according to an embodiment of the invention.

In FIG. 8, a device isolation film 402 for defining an active region and a non-active region is formed on a predetermined region of a p- type semiconductor substrate 400, and p- type impurity, e.g. boron ion, is implanted in the surface of the p- type semiconductor substrate 400, with an energy of about 400KeV and a density of about $1.0 \times 10^{13}$ through $2.0 \times 10^{13}$ ion atoms/cm$^2$. Then a thermal process is performed to form a p- type well region 404. The device isolation film 402 is formed by a device isolating method such as shallow trench isolation (STI). The device isolation film 402 may be formed of an oxide film of SOG (Spin On Glass), USG (Undoped Silicate Glass), BPSG (Boron Phosphorus Silicate Glass), PSG (Phosphor Silicate Glass), or PE-TEOS (Plasma Enhanced Tetra Ethyl Otho Silicate), and flowable oxide material. In addition, the device isolation film 402 may be formed as a multi film including two or more from the previous list for oxide films. Furthermore, the device isolation film 402 may be formed with a depth of about 2500 Å to 3000 Å, and may also be formed after the formation of the p- type well region.

Subsequently, the p- type impurity is ion implanted into the active region defined by the device isolation film 402, to form a threshold voltage control region 406. The threshold voltage control region 406 is formed by implanting the p- type impurity into the active region defined by the device isolation film 402, so that a threshold voltage of the recessed gate transistor is about 0.7V to 1.5V. For example, B or BF2 ion is implanted into the active region with energy of about 30KeV to 50KeV and a density of about $1.0 \times 10^{13}$ ion atoms/cm$^2$ to form the threshold voltage control region 406. In this case the threshold voltage control region 406 may be formed with a depth of about 1500 Å to 2000 Å.

Next, n- type impurity, e.g. P or As, is implanted with energy of about 15KeV to 20KeV and a density of about $1.0 \times 10^{12}$ to $1.0 \times 10^{13}$ ion atoms/cm$^2$, using the device isolation film 402 as an ion implantation mask, to form an impurity induction layer 408. The impurity induction layer 408 may be formed with a predetermined depth, e.g. about 1000 Å to 1500 Å, and may be desirably formed shallower than the threshold voltage control region 406, thereby resulting in a relative increase of a substrate density between bottoms of the source region and the drain region formed on the impurity induction layer 408 to prevent a short.

Figure 9:
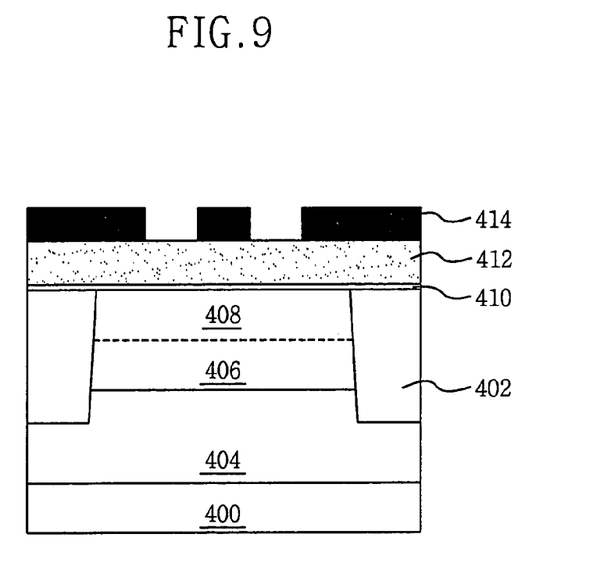

With reference to FIG. 9, a first insulation layer 410 is formed on an entire surface of the substrate after the process described above and in FIG. 8. Then a second insulation layer 412 with a predetermined thickness is formed. Subsequently, a photoresist pattern 414, for exposing a portion where a recessed gate is formed, is formed on the second insulation layer 412. The first insulation layer 410 may be formed of silicon nitride layer material to serve as an etch stopper and may be formed with a thickness of about 100 Å to 200 Å.

The second insulation layer 412 is formed on all upper parts of the active region and the non-active region and prevents a short between a gate formed on the non-active region, and the active region even though the gate is misaligned. The second insulation layer 412 is disposed under the gate formed on the non-active region so as to reduce a height of the gate and reduce the capacitance between adjacent gates. Furthermore, the second insulation layer 412 may be desirably formed with a thickness of about 800 Å to 1200 Å, considering the desired thickness of a gate conductive layer. The photoresist pattern 414 exposes only a portion of the active region so that the recessed gate conductive layer is formed only on the active region. It does not expose an upper part of the device isolation film 402. Thus, the photoresist pattern 414 can be desirably formed not exposing the device isolation film 402 and exposing only a portion of the active region.

Figure 10:
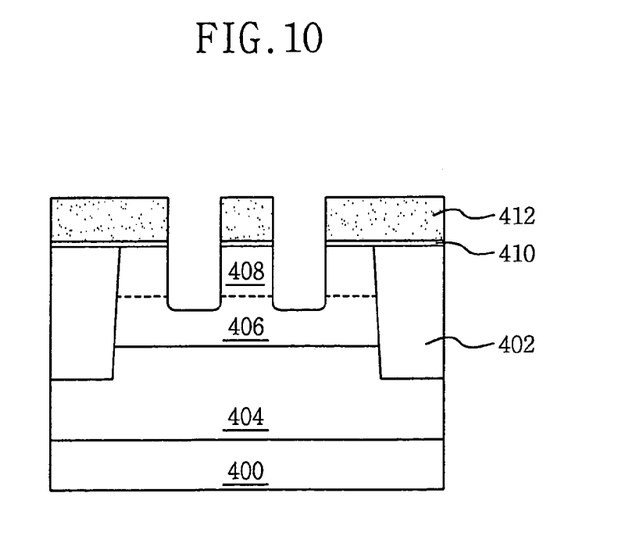

Referring to FIG. 10, the second insulation layer 412, the first insulation layer 410 and the substrate 400 are etched by using the photoresist pattern 414 as an etch mask. This forms a recess on the active region. Though the depth and length of the recess may be different according to various design rules, it may be desirable to form the recess with the depth of about 1200 Å to 1800 Å and length of about 700 Å to 900 Å. Then the photoresist pattern 414 is removed through a process such as an ashing or strip process.

Figure 11:
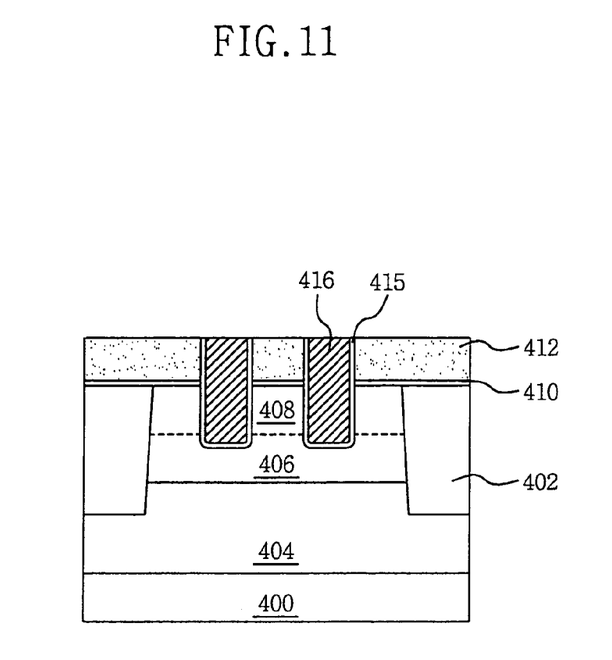

In FIG. 11, a gate insulation layer 415 is formed within the recess, then a first gate conductive layer 416 is formed to sufficiently fill the interior of the recess. The gate insulation layer 415 may be made of an oxide material with thickness of about 40 Å to 60 Å, and may be formed by thermally oxidizing a bottom face of the recess under dry oxygen at about 950° C. for about 20 minutes or through a deposition method such as a chemical vapor deposition (CVD) or sputtering. The first gate conductive layer 416 may be formed of polysilicon material, and may be planarized through a chemical mechanical polishing (CMP), etch-back, or other planarizing process, such that the upper surfaces of the first gate conductive layer 416 and the second insulation layer 412 are substantially coplanar.

Figure 12:
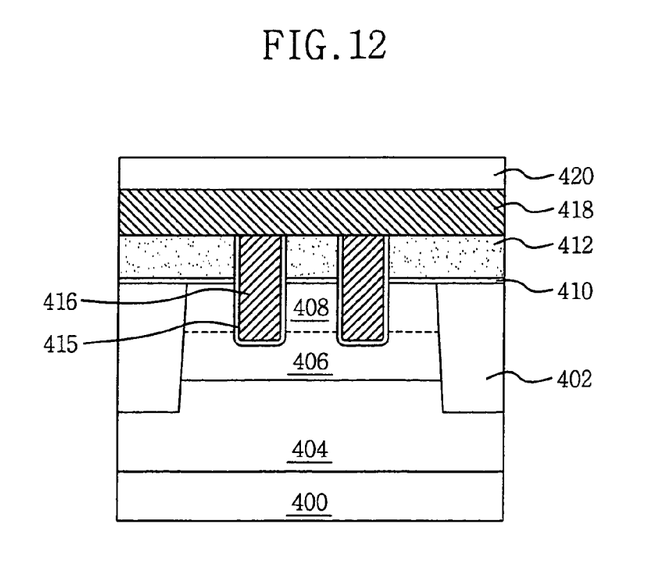

In FIG. 12, a second gate conductive layer 418 and a capping layer 420 are formed on the second insulation layer 412 and the first gate conductive layer 416. The second gate conductive layer 418 may be formed of tungsten (W) or a silicide layer of Ti, Ta, W, Ni, Cr, Ir, or Ru. Furthermore, the second gate conductive layer 418 may be formed through a general deposition method, for example, CVD, low-pressure chemical vapor deposition (LPCVD), or plasma CVD (PECVD). A conductive region formed of the second gate conductive layer 418 designates a first electrode region and a conductive region formed of the first gate conductive layer 416 indicates a second electrode region. Also the capping layer 420 may be formed of silicon nitride layer material, and may be formed through a CVD, LPCVD, PECVD, SACVD, SACVD (Semi-Atmospheric Chemical Vapor Deposition), sputtering or atomic layer deposition method.

Figure 13:
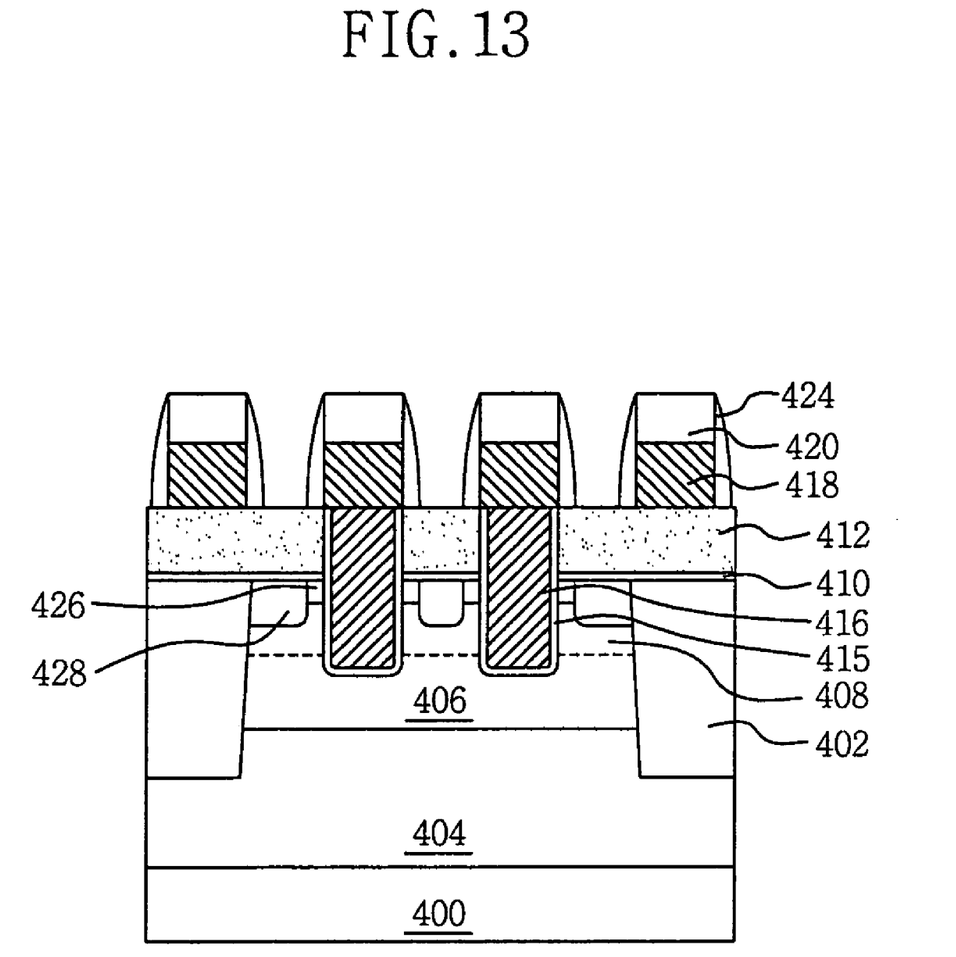

Referring to FIG. 13, a gate stack having the capping layer 420 formed on the second gate conductive layer 418 is formed thereon after the process described above referring to FIG. 12, through a photolithography process. Next, a gate spacer 424 is formed in a sidewall of the gate stack. Thus, the second gate conductive layers 418 are distanced substantially uniformly in a line on the active region and the non-active region, and the first gate conductive layer 416 is not formed on the non-active region and is only formed in a recess on the active region. Furthermore, the second insulation layer 412 is formed between the second gate conductive layer 418 formed on the non-active region and the active region, and as a result one of the inventive objectives is attained, that is, a short between the second gate conductive layer 418 and the active region is prevented.

Subsequently, n- type impurity, e.g. P or As, is implanted with energy of about 20KeV to 30KeV and a density of about $1.0\times10^{13}$ to $1.0\times10^{15}$ ion atoms/$Cm^2$, by using the gate spacer 424 as an ion implantation mask, to thus form a high density n+ type source/drain region 428 of a having an impurity density higher than the impurity induction layer 408, on a portion of the impurity induction layer 408. Consequently, a recessed gate transistor of the invention can be obtained. Also, before forming the gate spacer 424, n-type impurity of a density lower than the density of the n+ type source/drain region is ion implanted into the impurity induction layer 408 with low energy using the gate stack as an ion implantation mask. Thus, forming a low density n– type source/drain region 426. Then, the high density n+ type source/drain region 428 may be formed on a portion of the low density n– type source/drain region 426. In this manner, a source/drain region of LDD (Lightly Doped Drain) structure is formed.

A conventional gate conductive layer is formed on all active and non-active regions, thus a short is caused between a gate conductive layer formed on a non-active region and an active region because of a misalignment in forming a gate. Furthermore, a short may be also generated between a self aligned contact and the active region in a subsequent process.

According to an embodiment of the invention, the second gate conductive layers 418 are distanced from each other substantially uniformly in a line on an upper part of the active region and the non-active region. The first gate conductive layer 416 is formed in a recess only on the active region, to be connected to the second gate conductive layer 418. The second insulation layer 412 is formed between the second gate conductive layer 418 formed on the non-active region and the active region, thus even though the misalignment is generated in the formation of the gate, a short between the second gate conductive layer 418 formed on the non-active region and the active region can be prevented.

Furthermore, the first gate conductive layer 416 is not formed under the second gate conductive layer 418, but the second insulation layer 412 is formed thereunder, thus the height of the second gate conductive layer 418 formed on the non-active region is reduced, and more insulation material exists when the height is reduced, thereby lowering the capacitance between the gates.

As described above, according to embodiments of the invention, recessed gate transistor structures and methods of making the same prevent a short between a gate conductive layer formed on a non-active region and an active region by forming an insulation layer therebetween, even though a misalignment is generated in forming a gate.

In addition, both a height of a gate conductive layer formed on the non-active region is reduced and the capacitance between gates is reduced by forming an insulation layer under the gate conductive layer formed on the non-active region.

Embodiments of the invention may be practiced in many ways. What follows are exemplary, non-limiting descriptions of some of these embodiments.

An embodiment of the invention provides a recessed gate transistor forming method, the method including forming a device isolation film for defining an active region and a non-active region on a predetermined region of a semiconductor substrate; sequentially forming first and second insulation layers on an entire face of the substrate thereof; forming a recess on a portion of the active region; forming a gate insulation layer within the recess, then forming a first gate conductive layer within the recess; forming a second gate conductive layer on the second insulation layer and the first gate conductive layer; and forming source/drain regions that are distanced from one another and that are opposite to each other having the first gate conductive layer therebetween on the active region.

Herewith, the recess formed on a portion of the active region is obtained by forming a photoresist pattern for exposing a portion of the active region on the second insulation layer, then by sequentially etching the second insulation layer, the first insulation layer and the substrate through use of the photoresist pattern as an etch mask.

Furthermore, the method further includes planarizing the first gate conductive layer so that an upper surface of the first gate conductive layer and an upper surface of the second insulation layer are substantially coplanar, after forming the first gate conductive layer.

Also, the method further includes forming a capping layer on the second gate conductive layer after forming the second gate conductive layer, and then forming a gate spacer in a sidewall of the second gate conductive layer and the capping layer.

Another embodiment of the invention provides a structure of recessed gate transistor formed on a semiconductor substrate for which an active region and a non-active region are defined, includes first electrode regions that are distanced substantially uniformly from each other in a line on the active region and the non-active region; a second electrode region, which is extended to a predetermined depth into the semiconductor substrate from a lower part of the first electrode region formed on the active region and which is surrounded by a gate insulation layer; an insulation layer formed between the first electrode region and the active region; and source/drain regions, which are formed opposite to each other with the second electrode region therebetween on the active region.

It will be apparent to those skilled in the art that modifications and variations can be made to the exemplary embodiments without deviating from the spirit or scope of the invention. Thus, it is intended that the invention cover any such modifications and variations of this invention provided they come within the scope of the appended claims and their equivalents. Accordingly, these and other changes and modifications are seen to be within the true spirit and scope of the invention as defined by the appended claims.

The invention claimed is:

1. A method of forming a recessed gate transistor, the method comprising:
   forming a device isolation film for defining an active region and a non-active region, on a predetermined region of a semiconductor substrate;
   sequentially forming first and second insulation layers on the substrate;
   forming a recess in a portion of the active region, the recess extending through a portion of the first and second insulation layers;
   forming a gate insulation layer within the recess;
   forming a first gate conductive layer within the recess and on the gate insulation layer;
   forming a second gate conductive layer over the second insulation layer and the first gate conductive layer; and
   forming source and drain regions along opposite sides of the first gate conductive layer through the second insulation layer.

2. The method of claim 1, wherein the first insulation layer is formed of silicon oxide.

3. The method of claim 1, wherein the second insulation layer is formed of silicon nitride.

4. The method of claim 1, wherein the second insulation layer has a thickness of about 800 Å to 1200 Å.

5. The method of claim 1, wherein forming a recess in a portion of the active region comprises:
   forming a photoresist pattern for partially exposing the active region on the second insulation layer; and
   etching the second insulation layer, the first insulation layer and the substrate using the photoresist pattern as an etch mask.

6. The method of claim 1, wherein the recess formed on the portion of the active region has a depth of about 1200 Å to 1800 Å and a length of about 700 Å to 900 Å.

7. The method of claim 1, wherein the gate insulation layer comprises an oxide having a thickness of about 40 Å to 60 Å.

8. The method of claim 1, wherein the first gate conductive layer is made of polysilicon.

9. The method of claim 1, further comprising:
   planarizing the first gate conductive layer so that an upper surface of the first gate conductive layer and an upper surface of the second insulation layer are substantially coplanar;
   wherein forming the second gate conductive layer further comprises forming the second gate conductive layer over the upper surface of the second insulation layer and the upper surface of the first gate conductive layer, which are substantially coplanar.

10. The method of claim 9, wherein the planarization is performed through a process selected from the group consisting of chemical mechanical polishing (CMP) and etchback.

11. The method of claim 1, wherein the second gate conductive layer is formed of W or $WSi_x$.

12. The method of claim 1, wherein the second gate conductive layer comprises:
   a plurality of lines, having substantially uniform spacing, disposed on the second insulation layer and the first gate conductive layer.

13. The method of claim 1, further comprising:
   forming a capping layer on the second gate conductive layer; and
   forming a gate spacer in a sidewall of the second gate conductive layer and the capping layer.

14. The method of claim 1, further comprising:
   forming a lightly doped drain (LDD) structure having a source/drain region of low density and a source/drain region of high density.

15. A method of forming a recessed gate transistor, the method comprising:
   forming a device isolation film for defining an active region and a non-active region, on a predetermined region of a semiconductor substrate;
   sequentially forming first and second insulation layers on the substrate;
   forming a recess in a portion of the active region, the recess extending through a portion of the first and second insulation layers;
   forming a gate insulation layer within the recess;
   forming a first gate conductive layer within the recess and on the gate insulation layer;
   forming a second gate conductive layer over the second insulation layer and the first gate conductive layer;
   forming source and drain regions along opposite sides of the first gate conductive layer; and
   forming a gate spacer on a sidewall of the second gate conductive layer, and over the second insulation layer.

16. A method of forming a recessed gate transistor, the method comprising:
   forming a device isolation film for defining an active region and a non-active region, on a predetermined region of a semiconductor substrate;
   sequentially forming first and second insulation layers on the substrate, the second insulation layer having a first surface opposite a second surface, the second surface disposed facing the first insulating layer;
   forming a recess in a portion of the active region, the recess extending through a portion of the first and second insulation layers;
   forming a gate insulation layer within the recess;
   forming a first gate conductive layer within the recess and on the gate insulation layer;
   forming a second gate conductive layer over the first surface of the second insulation layer and the first gate conductive layer;
   patterning the second gate conductive layer, leaving a portion of the second gate conductive layer on the first surface of the second insulation layer; and
   forming source and drain regions along opposite sides of the first gate conductive layer.

17. A method of forming a recessed gate transistor, the method comprising:
   forming a device isolation film defining an active region and a non-active region, on a predetermined region of a semiconductor substrate;

sequentially forming first and second insulation layers on the substrate;

forming a recess in a portion of the active region, the recess extending through a portion of the first and second insulation layers;

forming a gate insulation layer within the recess;

forming a first gate conductive layer within the recess and on the gate insulation layer;

forming a second gate conductive layer over the second insulation layer in the non-active region and the first gate conductive layer in the active region; and forming source and drain regions along opposite sides of the first gate conductive layer.

* * * * *